United States Patent [19]

Tobita

[11] Patent Number: 4,806,788
[45] Date of Patent: Feb. 21, 1989

[54] SEMICONDUCTOR INTEGRATED CIRCUIT WITH DECREASED BURN-IN TIME

[75] Inventor: Youichi Tobita, Hyogo, Japan

[73] Assignee: Mitsubishi Denki Kabushiki Kaisha, Tokyo, Japan

[21] Appl. No.: 70,254

[22] Filed: Jul. 6, 1987

[30] Foreign Application Priority Data

Sep. 11, 1986 [JP] Japan .............................. 61-216710

[51] Int. Cl.$^4$ .......................................... H03K 17/687
[52] U.S. Cl. ................. 307/296 R; 307/362; 307/584; 323/311
[58] Field of Search .............. 307/200 B, 362–363, 307/577, 584, 296 R, 297; 323/311–312

[56] References Cited

U.S. PATENT DOCUMENTS

| | | | |
|---|---|---|---|
| 4,135,125 | 1/1979 | Oura | 307/297 X |
| 4,300,061 | 11/1981 | Mihalich et al. | 307/297 |
| 4,473,762 | 9/1984 | Iwahashi et al. | 307/297 X |
| 4,585,955 | 4/1986 | Uchida | 307/297 |
| 4,683,382 | 7/1987 | Sakurai et al. | 307/362 X |
| 4,692,689 | 9/1987 | Takemae | 307/297 X |

OTHER PUBLICATIONS

*IEEE ISSCC*, 1986, *Digest of Technical Papers*, "An Experimental 4Mb CMOS DRAM" by Tohru Furuyama et al., pp. 272–273.

*Primary Examiner*—David Hudspeth
*Attorney, Agent, or Firm*—Lowe, Price, LeBlanc, Becker & Shur

[57] ABSTRACT

A semiconductor integrated circuit is provided with an internal voltage generator to normally operate with internal source voltage which is lower than externally supplied source voltage and serves as operating source voltage. The semiconductor integrated circuit is further provided with a control circuit for controlling an internal source voltage generator so that voltage generated by the internal source voltage generator in burn-in or the like serves as first voltage which is higher than normal internal source voltage to accelerate the burn-in.

7 Claims, 4 Drawing Sheets

SEMICONDUCTOR INTEGRATED CIRCUIT WITH DECREASED BURN-IN TIME

BACKGROUND OF THE INVENTION

1. Field of the Invention

The present invention relates to a semiconductor integrated circuit which internally generates voltage lower than externally supplied source voltage to employ the generated internal voltage as operating source voltage, and more particularly, it relates to a semiconductor integrated circuit which can easily increase the burn-in speed.

2. Description of the Prior Art

As an integrated circuit is implemented with higher density of integration, transistors such as insulated gate field effect transistors (IGFET) must be reduced in size. On the other hand, it is necessary to retain the source voltage at 5 V in view of compatibility with TTL (transistor-transistor logic) circuits provided in the exterior of the integrated circuit.

However, when an IGFET in the integrated circuit is reduced in gate length while the source voltage is retained at 5 V, an electric field between drain and source of the IGFET is increased to exceed allowable breakdown voltage between the drain and the source. In order to avoid this, a conventional integrated circuit is adapted to generate voltage lower than externally supplied source voltage in an on-chip manner to employ the lower voltage as operating source voltage.

FIG. 1 shows the structure of a conventional voltage conversion circuit for generating low internal voltage. Referring to FIG. 1, the voltage conversion circuit is formed by a high-resistance resistor 7 having one end connected to a power terminal 4 for supplying external source voltage $V_{CC}$ and other end connected to a node 8, m (m: positive integer) diode-connected n-channel IGFETs $M_l$ to $M_m$ connected in series between the node 8 and a ground terminal 3 and an n-channel IGFET 6 of high current driving ability having one conductive terminal connected to the power terminal 4, other conductive terminal connected to a power terminal 2 of a main circuit 1 through an internal output terminal 5 and a gate connected to the node 8.

The main circuit 1 has the power terminal 2, a ground terminal 3a, a data input terminal 9 for receiving data from the exterior and a data output terminal 10 for outputting data to the exterior. Although not clearly shown in the figure, the structure of the main circuit 1 is substantially similar to a general semiconductor integrated circuit which is directly driven by externally supplied source voltage $V_{CC}$ except for that the IGFETs employed therein are reduced in gate length. Description is now made on the operation of the conventional circuit.

Assuming that the resistance value of the high-resistance resistor 7 is set at a value about 100 times the on-resistance of each of the m IGFETs $M_l$ to $M_m$, voltage V8 at the node 8 is expressed as follows:

$$V8 = m \cdot V_{TH} \qquad (1)$$

where $V_{TH}$ represents the threshold voltage of each of the IGFETs $M_l$ to $M_m$. When, for example, $V_{TH}=0.5$ V and m=8, $$V8 = 8 \times 0.5 = 4.0 V \qquad (2)$$

The node 8 is connected to the gate of the IGFET 6. Since the IGFET 6 serves as the so-called source follower, the source voltage of the IGFET 6, i.e., the voltage at an internal output terminal 5 is at a level lower by the threshold voltage $V_{TH}$ than the gate voltage V8.

Thus, voltage V5 at the internal output terminal 5 is as follows:

$$V5 = V8 - V_{TH} = 4.0 - 0.5 = 3.5 V \qquad (3)$$

This voltage V5 is supplied to the main circuit 1 through the power terminal 2 as the source voltage. As obvious from the expression (1), this voltage V5 is independent of the externally supplied source voltage $V_{CC}$. Since deviation of ±10% is allowed for the external source voltage $V_{CC}$, this action is taken simultaneously with voltage conversion to protect the main circuit 1 against bad influence by this variation. Namely, the conventional voltage conversion circuit is adapted to lower the externally supplied source voltage as well as to generate the voltage independent of the external source voltage.

An IGFET is an element which is controlled by voltage applied to a gate electrode on a thin insulation film formed on a channel region between a source and a drain.

Such an insulation film cannot be uniformly provided but is partially thinned in manufacturing of an actual IGFET. Such a thinned portion is deteriorated by long-time application of heat or an electric field and finally broken to cause malfunctioning of the element. In order to remove elements having such a potential defect, the manufacturer of the elements applies stress called dynamic burn-in to forcibly break the potential defective parts, thereby to reject devices having broken IGFETs through another examination.

It is preferable for the manufacturer to perform such dynamic burn-in as quickly as possible in view of productivity. Therefore, stress applying conditions are intensified as compared with normal conditions, to accelerate the burn-in time. For example, the ambient temperature is increased to 125° C. and the external source voltage $V_{CC}$ is raised to 7 to 8 V to accelerate the applied stress.

However, when an internal source voltage generator is provided in the aforementioned manner, stress acceleration cannot be performed by controlling the external source voltage $V_{CC}$ since the internal source voltage supplied to the main circuit is constant regardless of the external source voltage.

The aforementioned semiconductor integrated circuit having the on-chip internal source voltage generator is disclosed in "An Experimental 4Mb CMOS DRAM" by Tohru Furuyama et al., 1986 IEEE ISSCC, Digest of Technical Papers, pp. 272-273.

The internal source voltage generator of this prior art is adapted to prevent deviation of threshold voltage of an n-channel MOS-FET caused by hot carriers. However, the same has no circuit for stress acceleration for the case of dynamic burn-in or the like.

SUMMARY OF THE INVENTION

An object of the present invention is to provide a semiconductor integrated circuit having an internal source voltage generator, which can increase the burn-in speed by controlling external source voltage.

The semiconductor integrated circuit according to the present invention comprises a main circuit for normal operation through internal source voltage which is lower than external source voltage, an internal power circuit which is connected to an external source voltage input terminal for generating the internal source voltage lower than the external source voltage to supply the same to a source voltage input terminal of the main circuit and a control circuit which controls the internal source voltage circuit to generate first voltage higher than the internal source voltage in specific operation such as burn-in and supply the same to the source voltage input terminal of the main circuit.

According to the present invention, the control circuit is activated in the specific operation such as burn-in, so that the internal power circuit responsively generates the first voltage which is higher than the internal source voltage to supply the same to the main circuit as operating source voltage. Thus, the operating source voltage for the main circuit is increased during the burn-in to increase the burn-in speed, thereby to reduce the time required for the burn-in.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
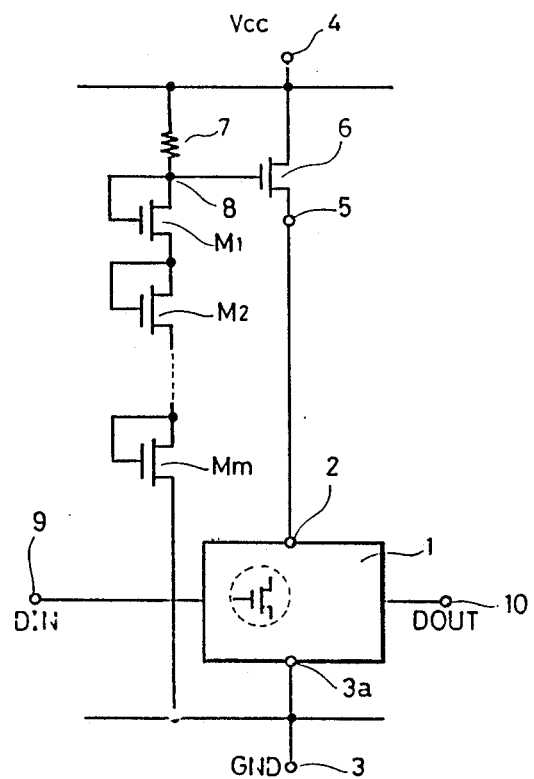
FIG. 1 illustrates the structure of an internal source voltage generator of a conventional semiconductor integrated circuit.
Figure 2:
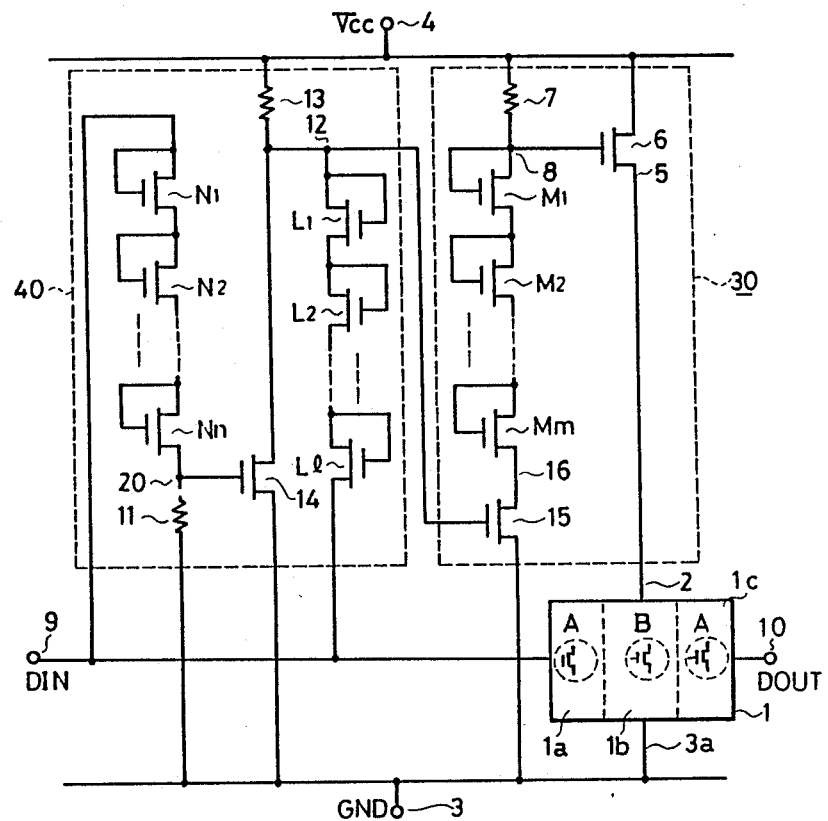
FIG. 2 illustrates the structure of an internal voltage generator of a semiconductor integrated circuit according to an embodiment of the present invention.

FIG. 2 illustrates the structure of a semiconductor integrated circuit according to an embodiment of the present invention. In FIG. 2, parts corresponding to those of FIG. 1 are indicated by the same reference numerals.

Referring to FIG. 2, the semiconductor integrated circuit according to the embodiment of the present invention comprises a main circuit 1 being substantially identical in structure to a general integrated circuit which is directly driven by external source voltage $V_{CC}$, a voltage conversion circuit 30 for converting the external source voltage $V_{CC}$ to generate internal source voltage for the main circuit 1 and a control circuit 40 for controlling the level of the internal source voltage generated by the voltage conversion circuit 30 in response to an externally supplied control signal.

The main circuit 1 has a signal input part 1a, an internal circuit 1b for performing prescribed functional operation and a signal output part 1c. The signal input part 1a includes a protection network (not shown), not to transmit voltage in excess of several times the external source voltage $V_{CC}$ even if high voltage such as surge voltage is applied to an external input terminal 9. The signal output part 1c is capable of converting signal levels, and is directly driven by the external source voltage $V_{CC}$. Therefore, the input and output circuit parts 1a and 1c are formed by IGFET(A)s of long gate length being identical in specification to those employed in a conventional integrated circuit which is directly driven by external source voltage $V_{CC}$. On the other hand, the internal circuit 1b is formed by IGFET(B)s of small size, i.e., of short gate length for improving the density of integration. The main circuit 1 further has a source voltage terminal 2, a ground terminal 3a and data input and output terminals 9 and 10.

The voltage conversion circuit 30 comprises a high-resistance resistor 7 having one end connected to an external power terminal 4 and other end connected to a node 8, m diode-connected IGFETs $M_l$ to $M_m$ connected in series between the node 8 and a node 16, an IGFET 15 having small on-resistance and connected between the node 16 and an external ground terminal 3 and having a gate connected to a node 12 and an IGFET 6 of high current driving ability, which has one conducting terminal (drain) connected to the external power terminal 4, other conducting terminal (source) connected to a power terminal 2 of the main circuit 1 through an internal output terminal 5 and a gate connected to a node 8.

The IGFETs 6, 15 and $M_l$ to $M_m$ are formed of the IGFET(A)s of long gate length.

The control circuit 40 comprises n diode-connected n-channel IGFETs $N_l$ to $N_n$ connected in series between the data input terminal 9 and a node 20, a high-resistance resistor 11 connected between the node 20 and an external ground terminal 3, a high-resistance resistor 13 having one end connected to the external power terminal 4 and other end connected to the node 12, an n-channel IGFET 14 having one conducting terminal connected to the node 12, other conducting terminal connected to the external ground terminal 3 and a gate connected to the node 20 and l diode-connected n-channel IGFETs $L_l$ to $L_l$ connected in series between the node 12 and the data input terminal 9.

Description is now made on the operation of this embodiment.

An external input signal $D_{IN}$ supplied to the data input terminal 9 has states of logics "0" and "1", and such logical values are realized by turning voltage levels of the signal to "H" and "L". In general, the "L" level is set within a range of $-1$ V to 0.8 V and the "H" level is set within a range of 2.4 V to 6.5 V. Assuming that n represents 15 and l represents 5 while the threshold voltage of each IGFET is 0.5 V, the "H" level of the external input signal $D_{IN}$ is at 6.5 V and the "L" level is at $-1$ V, the voltage level of the node 20 is at the level of a ground potential GND and the voltage level of the node 12 is at the external source voltage $V_{CC}$. Consequently, the IGFET 15 enters an ON state. Since the on-resistance of the IGFET 15 is set at a sufficiently small value, the voltage level of the node 16 is at the level of the ground potential GND.

This state is identical to that as hereinabove described with reference to FIG. 1, and assuming that m represents 8, a potential of 3.5 V is generated at an output point 5 to be supplied to the power terminal 2 of the main circuit 1. The voltage level of the node 20 is at the ground potential GND level because an IGFET equivalently having threshold voltage of 7.5 ($=15\times0.5$) V is provided between the nodes 9 and 20 by the 15 IGFETs between the nodes 9 and 20 and the voltage of the external input signal $D_{IN}$, being at the level of 6.5 V or $-1$ V, will not act on the node 20, whereby the node 20 is not grounded through the resistor 11. Similarly, the voltage of the external input signal $D_{IN}$ will not act on the node 12 because an IGFET equivalently having threshold voltage of 2.5 ($=5\times0.5$) V is provided between the node 12 and the input terminal 9 by the five IGFETs between the node 12 and the input terminal 9, and hence the voltage of 6.5 V or $-1$ V applied to the input terminal 9 will not act on the node 12. Even if all of the five IGFETs $L_l$ to $L_l$ (l=5) enter ON states when the voltage of the external input signal $D_{IN}$ is at $-1$ V, voltage of the node 12 will not be lower than 1.5 V by the threshold voltage thereof. The value of 1.5 V is sufficient to make the IGFET 15 enter an ON state.

The aforementioned operation is that in the case of applying voltage in a normal range to the input terminal 9, and the internal source voltage supplied to the power terminal 2 of the main circuit 1 is at a normal level of 3.5 V at this time.

When the voltage level of the external input signal $D_{IN}$ is set at a potential out of the normal range, for example, when the "H" level is set at 8.5 V, all of the 15 IGFETs $N_l$ to $N_n$ (n=15) enter ON states and the voltage level of the node 20 is at $8.5-7.5=1.0$ V. This voltage level of 1.0 V is sufficient to make the IGFET 14 enter an ON state, and the voltage level of the node 12 is at the ground potential GND level through the IGFET 12. As the result, the IGFET 15 enters an OFF state and the voltage level of the node 8 is increased to the level of the external source voltage $V_{CC}$, and the level of the internal output point 5 becomes $V_{CC}-V_{TH}=5.0-0.5=4.5$ V in response.

On the other hand, when the "L" level of the external input signal $D_{IN}$ supplied to the input terminal 9 is set at $-2.5$ V, the IGFETs $L_l$ to $L_l$ enter ON states whereby the voltage level of the node 12 is $-2.5+2.5$ ($=0.5\times5$) $=0$ V, which is substantially identical to the ground potential GND level. As the result, the voltage level of the internal output point 5 is increased to 4.5 V similarly to the case of "H" $=8.5$ V.

Referring to FIG. 2, the resistors 11 and 13 have resistance value sufficiently higher than the on-resistance value of each of the IGFETs $L_l$ to $L_l$ and hence influence of the resistors 11 and 13 to the voltage levels at the nodes 20 and 12 can be neglected when the IGFETs $N_l$ to $N_n$ and $L_l$ to $L_l$ are in ON states.

As hereinabove described, normal internal source voltage can be supplied to the power terminal 2 of the main circuit 1 by the control circuit 40 when the external input signal $D_{IN}$ is within the range for normal operation, while first voltage, which is higher than the normal internal source voltage, can be supplied to the power terminal 2 of the main circuit 1 when the external input signal $D_{IN}$ is within a prescribed range out of the normal operating range. The prescribed range is that higher than 8.5 V or lower than $-2.5$ V in the aforementioned embodiment.

Although the prescribed ranges of the external input signal for activating the control circuit 40 are set at that higher than 8.5 V and that lower than $-2.5$ V, only one of the ranges may be employed. The IGFETs $L_l$ to $L_l$ are not required when the prescribed range is set only in that higher than 8.5 V in the control circuit 40 of FIG. 2, while the IGFETs $N_l$ to $N_n$ and the resistor 11 are not required when the prescribed range is set only in that lower than $-2.5$ V.

While the level of the internal source voltage is controlled by the level of the signal supplied to only a single external signal input terminal in the aforementioned embodiment, two external signal input terminals may be employed to control the level of the internal source voltage.

Figure 3:
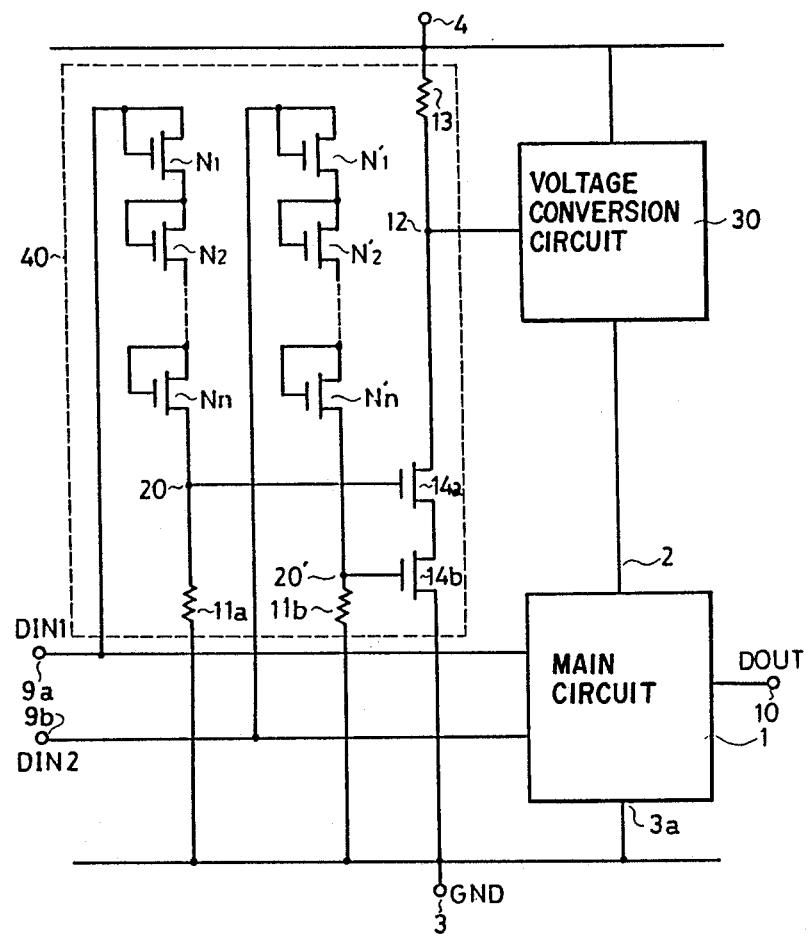
FIG. 3 illustrates the structure of an internal voltage generator of a semiconductor integrated circuit according to another embodiment of the present invention.

FIG. 3 illustrates the structure of another embodiment of the semiconductor integrated circuit according to the present invention. In FIG. 3, parts corresponding to those of FIG. 2 are indicated by the same reference numerals. Referring to FIG. 3, a control circuit 40 comprises n diode-connected n-channel IGFETs $N_l$ to $N_n$ connected in series between a first external signal input terminal 9a and a node 20, a high-resistance resistor 11a connected between the node 20 and an external ground terminal 3, n diode-connected n-channel IGFETs $N'_l$ to $N'_n$ connected in series between a second external input terminal 9b and a node 20', a high-resistance resistor 11b connected between the node 20' and the external ground terminal 3, a high-resistance resistor 13 connected between an external power terminal 4 and a node 12 and two n-channel IGFETs 14a and 14b connected in series between the node 12 and the external ground terminal 3. The gate of the IGFET 14a is connected to the node 20 and the gate of the IGFET 14b is connected to the node 20'. The IGFETs 14a and 14b are identical in threshold voltage and on-resistance to the IGFET 14 of FIG. 2.

In this structure, the IGFETs 14a and 14b simultaneously enter ON states only when the two input terminals 9a and 9b are simultaneously supplied with voltage of a prescribed range (higher than 8.5 V in both terminals), so that a voltage conversion circuit 30 can generate first voltage. According to this structure, probability of malfunctioning of the control circuit 40 caused by surge voltage or the like in normal operation can be reduced since high voltage such as surge voltage is hardly simultaneously applied to the two input terminals 9a and 9b in normal operation.

While the two external input terminals are simultaneously supplied with control signals in the same prescribed range to generate the first voltage in the embodiment as shown in FIG. 3, the first voltage can be generated by supplying control signals of different polarity in a prescribed range to the two external input terminals.

Figure 4:
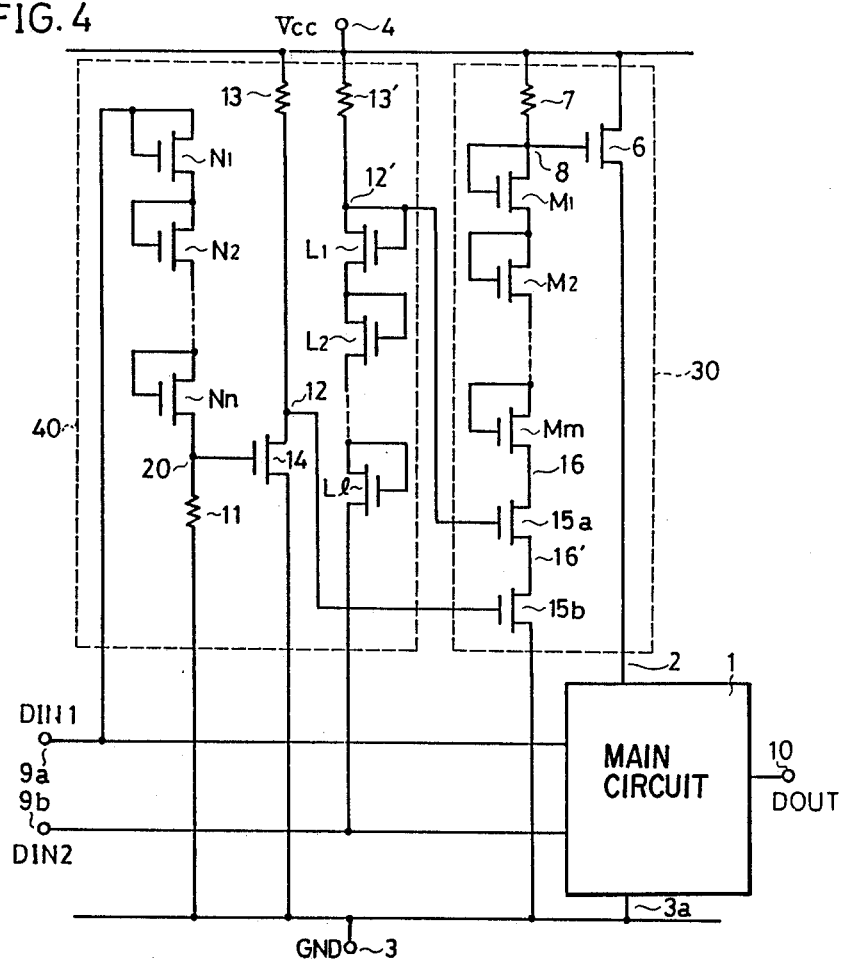
FIG. 4 illustrates the structure of an internal voltage generator of a semiconductor integrated circuit according to still another embodiment of the present invention.

FIG. 4 illustrates the structure of a semiconductor integrated circuit according to still another embodiment of the present invention. Referring to FIG. 4, a control circuit 40 comprises n diode-connected n-channel IGFETs $N_l$ to $N_n$ connected in series between a first external input L terminal 9a and a node 20, a high-resistance resistor 11 connected between the node 20 and an external ground terminal 3, a high-resistance resistor 13 having one end connected to an external power terminal 4 and other end connected to a node 12, an n-channel IGFET 14 having one conducting terminal connected to the node 12, other conducting terminal connected to the external ground terminal 3 and a gate connected to the node 20, a high-resistance resistor 13' having one end connected to the external power terminal 4 and other end connected to a node 12' and l diode-connected n-channel IGFETs $L_l$ to $L_l$ connected in series between the node 12' and an external signal input terminal 9b.

A voltage conversion circuit 30 comprises a high-resistance resistor 7 having one end connected to an external power terminal 4 and other end connected to a node 8, m diode-connected n-channel IGFETs M$_l$ to M$_m$ connected in series between the node 8 and a node 16, an n-channel IGFET 15a of small on-resistance having one conducting terminal connected to the node 16, a gate connected to the node 12' and other conducting terminal connected to a node 16', an n-channel IGFET 15b of small on-resistance having one conducting terminal connected to the node 16', a gate connected to the node 12 and other conducting terminal connected to the external ground terminal 3 and an n-channel IGFET 6 having one conducting terminal connected to the external power terminal 4, other conducting terminal connected to a power terminal 2 of the main circuit 1 and a gate connected to the node 8. The IGFETs 15a and 15b are identical in threshold voltage to the IGFET 15 of FIG. 2.

In the aforementioned structure, the external signal input terminal 9a is supplied with voltage of a higher prescribed range (higher than 8.5 V) and the external signal input terminal 9b is supplied with voltage of a lower prescribed range (lower than −2.5 V). When the input terminals 9a and 9b are supplied with signals in a normal operating range, both of the IGFETs 15a and 15b enter ON states so that normal internal source voltage is supplied to the main circuit 1 through the IGFET 6. When the input terminals 9a and 9b are supplied with voltage in a prescribed range out of the normal operating range, at least one of the IGFETs 15a and 15b enters an OFF state, whereby first voltage higher than the normal internal source voltage is supplied to the power terminal 2 of the main circuit 1 through the IGFET 6.

Thus, when the levels of the voltage applied to the two external input terminals 9a and 9b are set in the prescribed ranges of higher than 8.5 V and lower than −2.5 V, such probability that the control circuit 40 is caused to malfunction by surge voltage or the like in normal operation to generate the first voltage can be further reduced since the input terminals 9a and 9b are hardly simultaneously supplied with surge voltages of such opposite polarity.

The prescribed ranges (higher than 8.5 V and lower than −2.5 V) in the above description are preferable values set with margins in order to avoid malfunctioning. Therefore, the prescribed ranges may be as closest as possible to the normal operating range in principle, while the normal operating range can be varied with specification.

Although the first voltage has a threshold voltage drop in the IGFET 6 in each of the aforementioned embodiments, the first voltage may not include such a threshold voltage drop.

Figure 5:
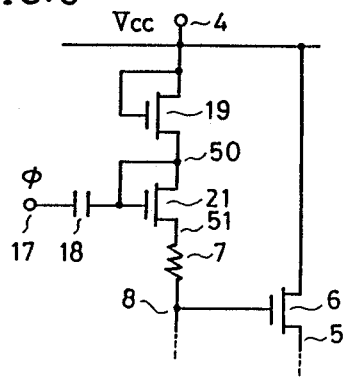
FIG. 5 illustrates the structure of an internal voltage generator of a semiconductor integrated circuit according to a further embodiment of the present invention.

FIG. 5 illustrates a modification of the voltage conversion circuit in the semiconductor integrated circuit according to the present invention. Only modified parts of the voltage conversion circuit are shown in FIG. 5. Remaining parts of this circuit, which are not shown in this figure, are the same with the structure of FIG. 2 or 4. Referring to FIG. 5, diode-connected n-channel IGFETs 19 and 21 are connected in series between an external power terminal 4 and a resistor 7. The gate of the IGFET 21 is connected to an AC signal input terminal 17 through a bootstrap capacitance 18.

Description is now made on the operation of this circuit.

First, a node 50 between the IGFET 21 and a resistor 7 is charged at $V_{CC} - 2V_{TH}$ by voltage applied to an external power terminal 4 through the IGFETs 19 and 21. Symbol $V_{TH}$ represents the respective threshold voltages of the IGFETs 19 and 21. Then, when an AC signal $\phi$ rises, the node 50 is charged through the capacitance 18, whereby the voltage level at the node 50 is increased. Simultaneously with this, the IGFET 21 enters an ON state to transfer the charge to a node 51, whereby the voltage 0 level at the node 51 is increased. When the AC signal $\phi$ falls, the charge is extracted from the node 50 through the capacitance 18, whereby the voltage level at the node 50 is lowered. However, the IGFET 19 is in an ON state at this time to be charged by the voltage $V_{CC}$ of the external power terminal 4, whereby the voltage level at the node 50 is recovered to $V_{CC} - V_{TH}$ On falling of the AC signal $\phi$, the voltage level at the node 51 is held by the second rectifying IGFET 21. The voltage level at the node 51 is gradually increased by repeated supply of the AC signal $\phi$, to reach $2(V_{CC} - V_{TH})$ assuming that $V_{CC}$ represents the amplitude of the AC signal.

When an external input signal $D_{IN}$ is out of a normal operating range, i.e., when the input signal $D_{IN}$ is within a prescribed range, the said voltage level is directly transferred to a node 8 so that the IGFET enters an ON state in a voltage variable resistance region, and voltage of the external source voltage $V_{CC}$ level is transferred from the IGFET 6 to an internal output point 5. In other words, the voltage of the internal output point 5 includes no threshold voltage drop of the IGFET 6.

Although n-channel IGFETs are employed in the aforementioned embodiments, the present invention can be carried out by employing p-channel IGFETs.

Further, the resistors 7, 11 and 13 may be formed by IGFETs.

Although the data input terminals are employed as external input terminals in the aforementioned embodiments, an external address input terminal, a chip enable input terminal or a write enable input terminal may be employed when the main circuit is formed by a memory device, to obtain an effect similar to those of the above described embodiments. The present invention can be readily carried out particularly by employing an input terminal for a signal such as a chip enable signal (chip select signal), which can be fixed at an "L" or "H" level during dynamic burn-in.

According to the present invention as hereinabove described, the level of a signal supplied to at least one input terminal is set in a prescribed range out of that employed for normal operation to increase voltage generated by an internal source voltage generator without increasing the number of terminals and to speed up dynamic burn-in of a semiconductor integrated circuit having an internal source voltage generator, thereby to reduce the time required for dynamic burn-in.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising a main circuit operative in first and second modes of operation and having an external power terminal for receiving an externally supplied voltage source, at least one external input terminal connected to said main circuit for receiving an externally supplied master signal, said semiconductor integrated circuit further comprising:
- an internal voltage source, said internal voltage source supplying a voltage that is lower than said external source voltage supplied to said external power terminal;
- a control circuit activated in response to said master signal to generate a control signal, said control signal having first and second states corresponding, respectively, to said first and second modes of operation of said main circuit; and
- an internal power circuit connected to said external power terminal and to said internal voltage source and responsive to said control signal, said internal power circuit supplying a first voltage lower than said external source voltage to said main circuit in response to said control signal in said first state, and supplying a second voltage higher than said first voltage to said main circuit in response to said control signal in said second state.

2. A semiconductor integrated circuit in accordance with claim 1, wherein said external signal input terminal is supplied with a master signal of a level within a prescribed normal operating range when said main circuit is in said normal operation and said control circuit is activated when the level of said master signal supplied to said external input terminal is within a prescribed range out of said normal operating range.

3. A semiconductor integrated circuit in accordance with claim 2, wherein a plurality of said external input terminals are provided and said control circuit is activated only when the levels of master signals supplied to said plurality of external input terminals are simultaneously in respective prescribed ranges.

4. A semiconductor integrated circuit in accordance with claim 2, wherein said prescribed range do not overlap each other.

5. A semiconductor integrated circuit in accordance with claim 1, wherein said internal power circuit includes an insulated gate field effect transistor (6) provided between said external power terminal and a source voltage terminal (2) of said main circuit and having a gate and a threshold voltage, said internal source voltage being provided by subtracting said threshold voltage from voltage applied to said gate of said insulated gate field effect transistor,
said semiconductor integrated circuit further including boosting means coupled to said gate of said insulated gate field effect transistor for bootstrapping the gate voltage of said insulated gate field effect transistor to drive said insulated gate field effect transistor in a voltage variable resistance region so that a drop of said threshold voltage is not included in said first voltage.

6. A semiconductor integrated circuit in accordance with claim 1, wherein said control circuit comprises a plurality of insulated gate field effect transistors ($N_l$ to $N_n$) serially connected between said external input terminal and a ground potential, said plurality of insulated gate field effect transistors being diode-connected respectively.

7. A semiconductor integrated circuit in accordance with claim 1, wherein said control circuit comprises a plurality of insulated gate field effect transistors ($L_l$ to $L_l$) connected in series between said external input terminal and said external power terminal, said plurality of insulated gate field effect transistors being diode-connected respectively.

* * * * *